United States Patent
Clark et al.

(10) Patent No.: US 7,715,210 B2
(45) Date of Patent: May 11, 2010

(54) PATCH PANEL CHASSIS

(75) Inventors: Gordon Clark, Eden Prairie, MN (US); Loren Mattson, Richfield, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 0 days.

(21) Appl. No.: 12/378,398

(22) Filed: Feb. 13, 2009

(65) Prior Publication Data

US 2009/0154129 A1    Jun. 18, 2009

Related U.S. Application Data

(62) Division of application No. 10/714,502, filed on Nov. 13, 2003, now Pat. No. 7,495,931.

(51) Int. Cl.
*H05K 7/14* (2006.01)
(52) U.S. Cl. ...................... 361/802; 361/800
(58) Field of Classification Search .............. 361/752, 361/790, 797, 800, 686, 756, 728–730; 312/223
See application file for complete search history.

(56) References Cited

U.S. PATENT DOCUMENTS

| | | | |
|---|---|---|---|
| 4,002,381 A * | 1/1977 | Wagner et al. ............... 312/183 |
| 4,470,100 A | 9/1984 | Rebaudo et al. | |
| 4,486,816 A | 12/1984 | Hope | |
| 4,840,568 A | 6/1989 | Burroughs et al. | |
| 4,926,009 A | 5/1990 | Van Leeuwen | |
| 5,129,842 A | 7/1992 | Morgan et al. | |
| 5,199,878 A | 4/1993 | Dewey et al. | |
| 5,218,519 A | 6/1993 | Welch et al. | |
| 5,393,249 A | 2/1995 | Morgenstern et al. | |
| 5,467,062 A | 11/1995 | Burroughs | |
| 5,506,751 A | 4/1996 | Chatel | |
| 5,546,282 A | 8/1996 | Hill et al. | |
| 5,685,741 A | 11/1997 | Dewey et al. | |
| 5,735,407 A | 4/1998 | Kallio | |
| 6,116,961 A | 9/2000 | Henneberger et al. | |
| 6,120,116 A | 9/2000 | Phillips | |
| 6,134,119 A | 10/2000 | Gunther et al. | |
| 6,589,062 B1 | 7/2003 | Ogren et al. | |
| 7,054,163 B2 | 5/2006 | Coffey | |
| 7,453,706 B2 | 11/2008 | Clark et al. | |
| 7,495,931 B2 | 2/2009 | Clark et al. | |
| 2004/0165366 A1 | 8/2004 | Schnabel et al. | |

FOREIGN PATENT DOCUMENTS

DE    G 91 13 520.6    12/1991
DE    298 18 281 U1    1/1999

* cited by examiner

*Primary Examiner*—Hung S Bui
(74) *Attorney, Agent, or Firm*—Merchant & Gould P.C.

(57) ABSTRACT

A patch panel system including a chassis and a plurality of modules. The chassis includes elongated structures configured to interconnect top, bottom and side portions of the chassis. The elongated structures are also configured to receive and secure a printed circuit board and the plurality of modules to the chassis. The modules include a housing and a module card. The card can include a variety of connections that provide communication to connections located on a back plane of the chassis. The system can include a combination of passive and active modules that are interchangeable to provide a variety of interface configurations.

14 Claims, 19 Drawing Sheets

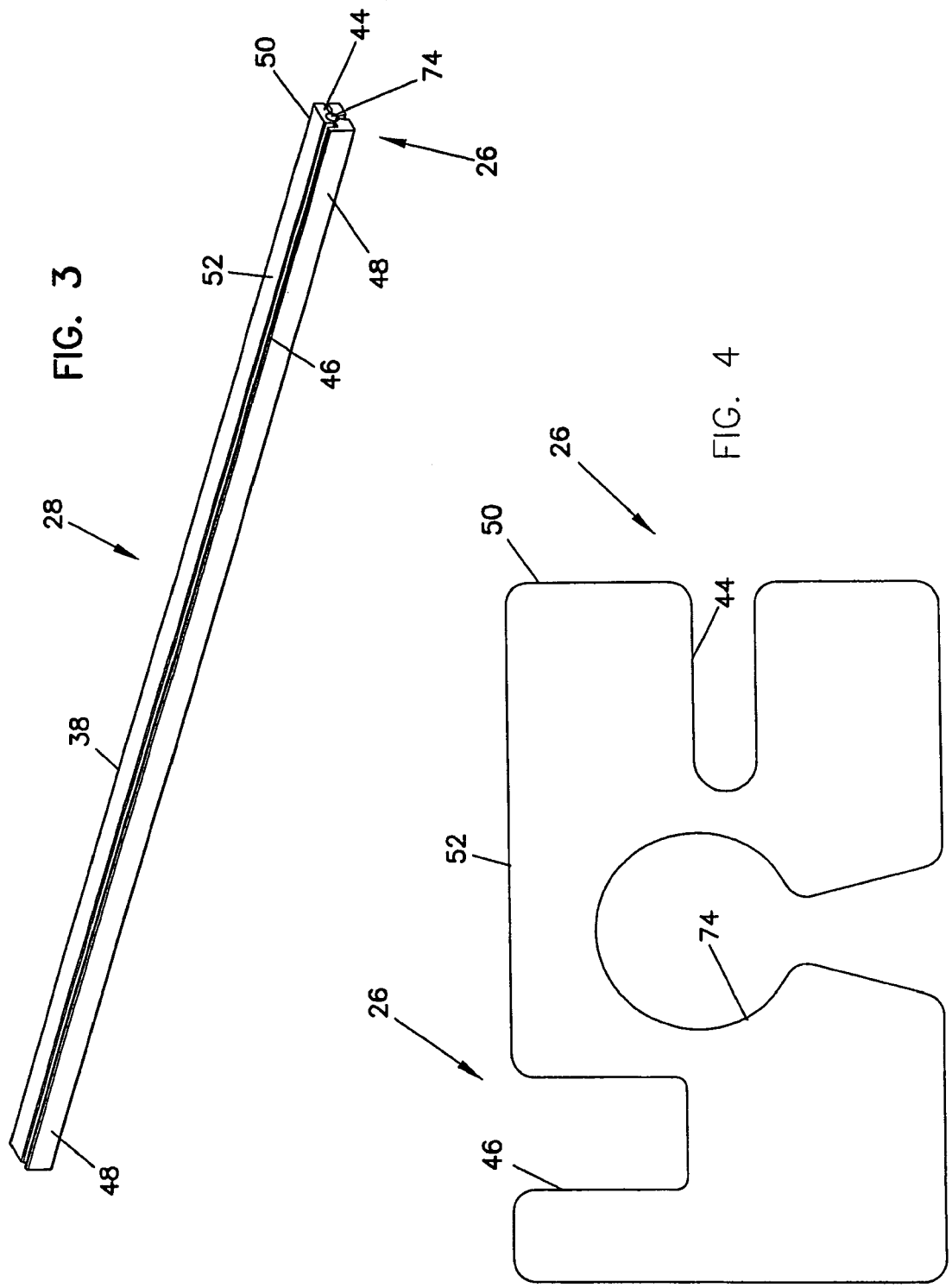

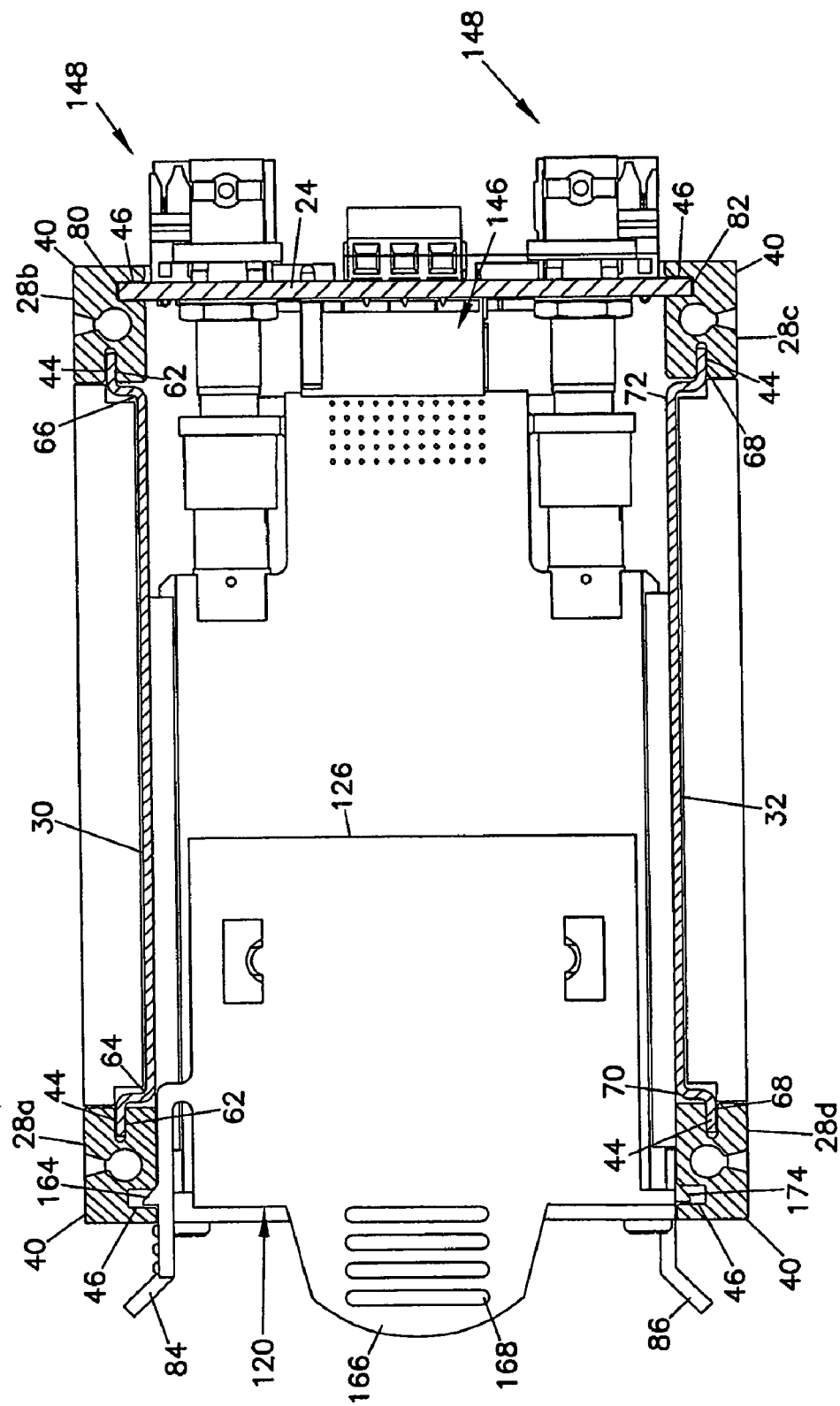

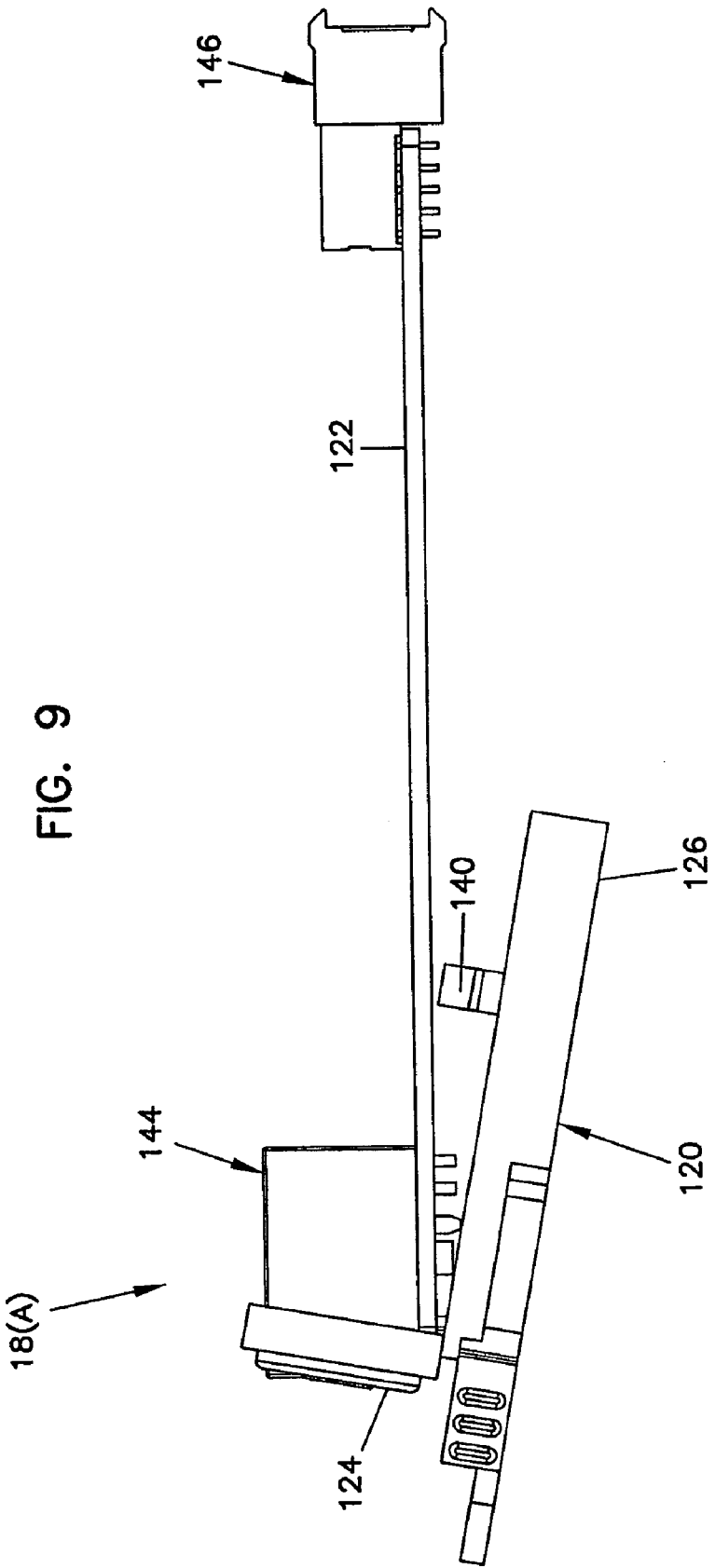

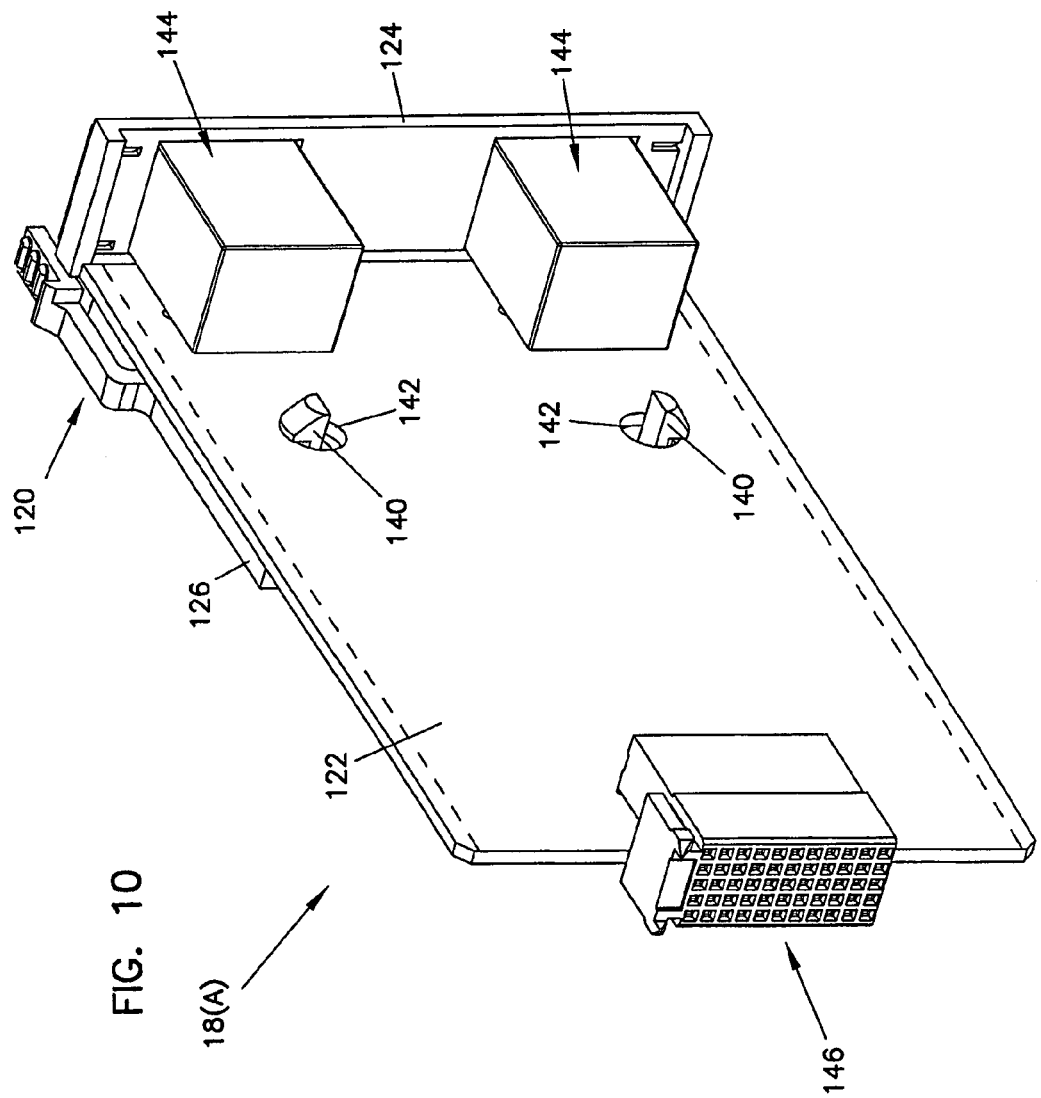

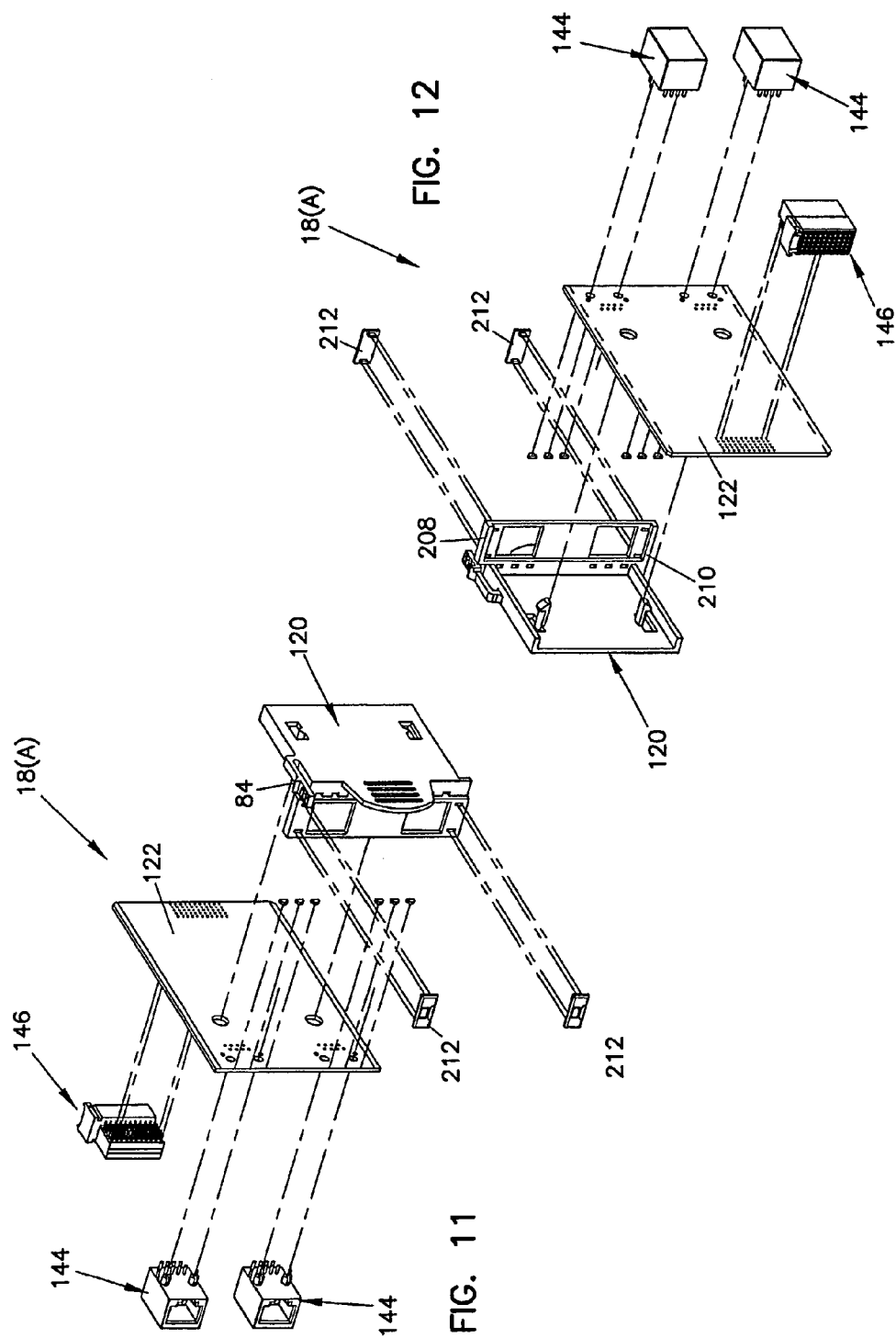

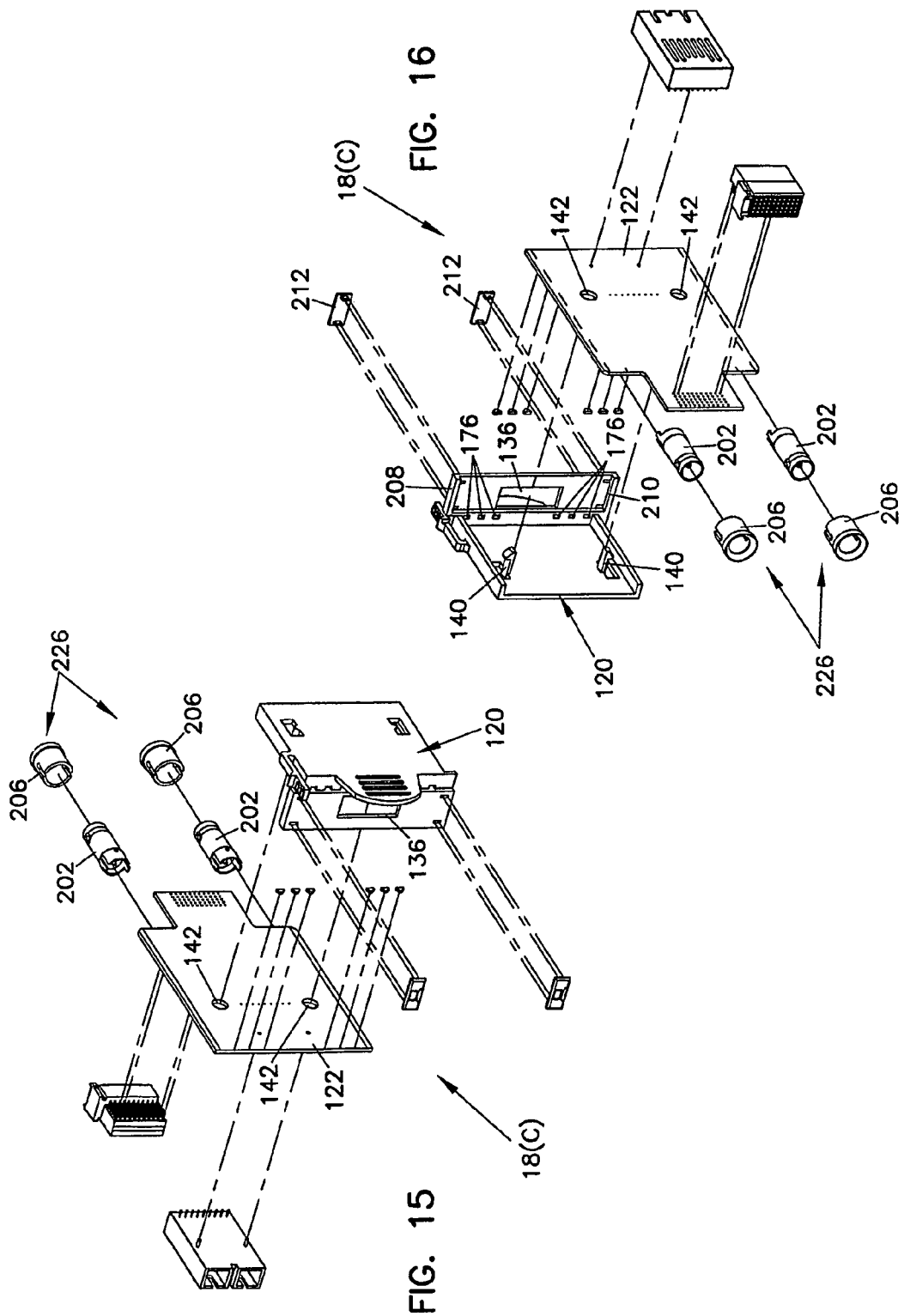

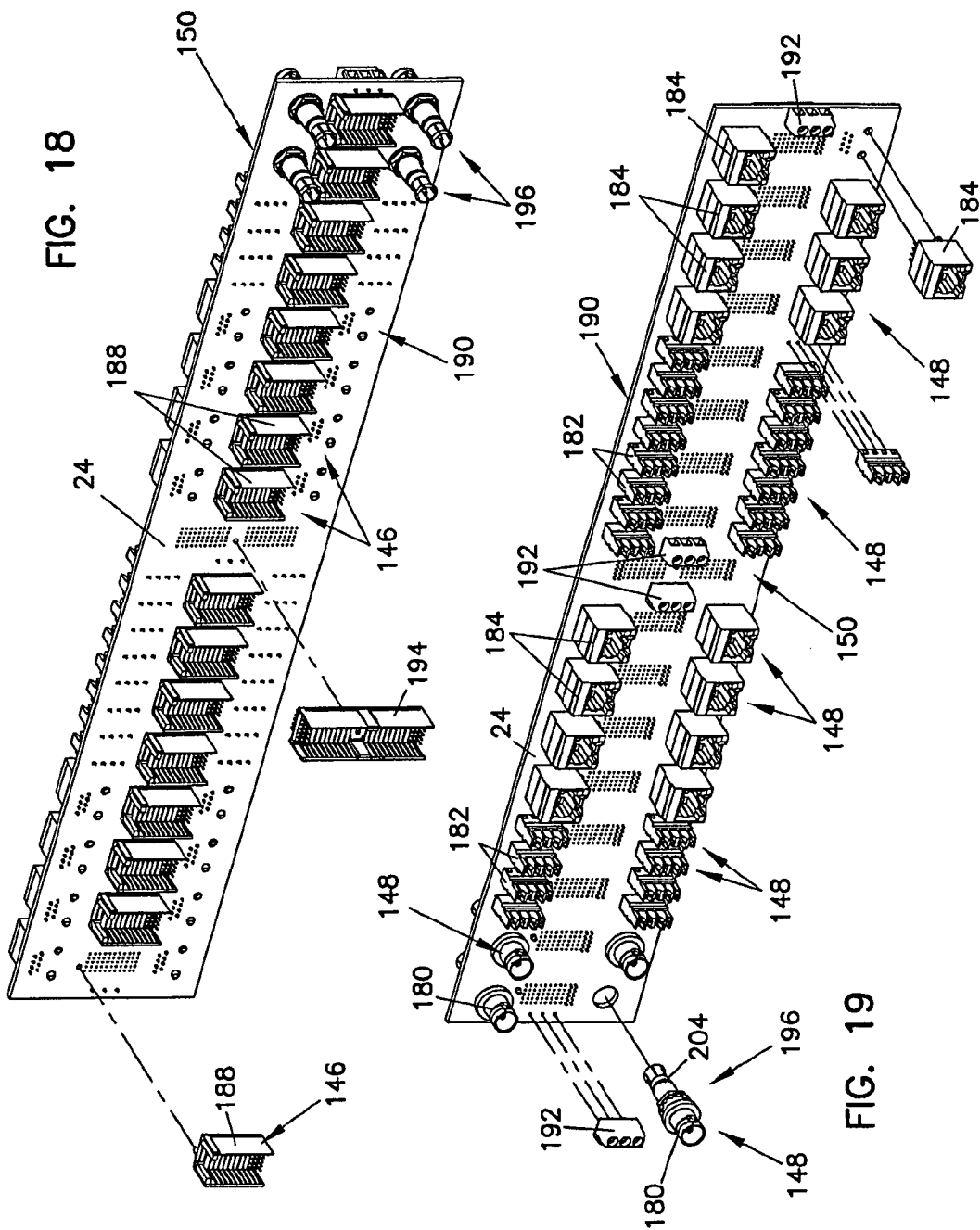

PATCH PANEL CHASSIS

CROSS-REFERENCE TO RELATED APPLICATIONS

This application is a divisional application of U.S. application Ser. No. 10/714,502, filed Nov. 13, 2003 now U.S. Pat. Ser. No. 7,495,931, which application is related to U.S. application Ser. Nos. 10/714,538 and 10/714,583, now U.S. Pat. Nos. 7,054,163 and 7,453,706 respectively, each also filed Nov. 13, 2003; which applications are incorporated herein by reference.

TECHNICAL FIELD

This disclosure relates generally to devices and assemblies for patch panel systems. More particularly, this disclosure relates to a patch panel chassis with multi-interface modules.

BACKGROUND

Patch panels are used to provide an interconnection between network elements. Patch panels typically a number of interconnecting modules positioned within a patch panel housing.

Conventional patch panel housings are manufactured from bent sheetmetal. That is, the process of manufacturing such housings includes bending sheetmetal to form a top, a bottom and sides of the housing. The top, bottom and sides of the sheetmetal housing are typically held together by a number of fasteners. Additional fasteners are used to secure a back plane or panel to the sheet metal housing. The number of bent sheetmetal constructions and fasteners involve significant time and labor in the manufacture and assembly of conventional patch panel housings.

Conventional interconnecting modules used with these patch panel housings are generally configured as pass-through interconnections that provide patching interfaces to cables. If more functionality is required, such as power injection, a dedicated panel or external ancillary device (such as a power supply) along with additional patch cables are required.

In general, improvement has been sought with respect to such system and arrangements, generally to better accommodate: manufacture and assembly of the system, and adaptability of the system for a variety of applications.

SUMMARY

One aspect of the present disclosure relates to a patch panel system including a chassis and a plurality of modules. The patch panel system may be used in combination with a chassis having elongated structures that interconnects top, bottom, and side portions of the chassis. The elongated structures are configured to receive a printed circuit board that defines a back plane of the system, and receive the plurality of modules within an interior of the chassis.

In another aspect, the present disclosure relates to modules used with a patch panel system. The modules include a housing and a module card. The card can be configured with a variety of connections that provide communication to connections located on a back plane of the chassis.

In still another aspect, the present disclosure relates to a patch panel system including passive modules and active modules. The passive and active modules are configured and arranged to interchange with one another to provide a variety of system interface configurations.

A variety of examples of desirable product features or methods are set forth in part in the description that follows, and in part will be apparent from the description, or may be learned by practicing various aspects of the disclosure. The aspects of the disclosure may relate to individual features as well as combinations of features. It is to be understood that both the foregoing general description and the following detailed description are explanatory only, and are not restrictive of the claimed invention.

BRIEF DESCRIPTION OF THE DRAWINGS

FIG. 3 is perspective view of one embodiment of an elongated chassis structure shown in FIG. 2;

FIG. 4 is an enlarged, elevational end view of the elongated chassis structure of FIG. 3;

FIG. 5 is a cross-sectional view of the chassis of FIG. 1, shown with the modules inserted within the chassis, taken along line 5-5;

FIG. 9 is a top plan view of the module of FIG. 8;

FIG. 10 is rear perspective view of the module of FIG. 8, shown with the module card and housing fully assembled;

FIG. 11 is an exploded front perspective view of the module shown in FIG. 8;

FIG. 12 is an exploded rear perspective view of the module shown in FIG. 8;

FIG. 15 is an exploded front perspective view of the module shown in FIG. 14;

FIG. 16 is an exploded rear perspective view of the module shown in FIG. 14;

FIG. 18 is a front perspective view of one embodiment of the printed circuit board shown in FIG. 2;

FIG. 19 is a rear perspective view of the printed circuit board of FIG. 18;

DETAILED DESCRIPTION

Reference will now be made in detail to various features of the present disclosure that are illustrated in the accompanying drawings. Wherever possible, the same reference numbers will be used throughout the drawings to refer to the same or like parts.

The present disclosure relates to a patch panel system 100 (FIGS. 1 and 23) that is a multi-interface system. The system 100 includes a chassis 10 configured to receive a plurality of modules 18.

The plurality of modules may include a number of modules 18 each having different electrical configurations. Each of the different module configurations 18 includes some similar features, such similar features being referenced with the same reference number in each embodiment. For purposes of clarification, however, the modules are represented as modules 18(A)-18(D) to identify some of the various module embodiments of the present disclosure.

I. Chassis

Figure 1:
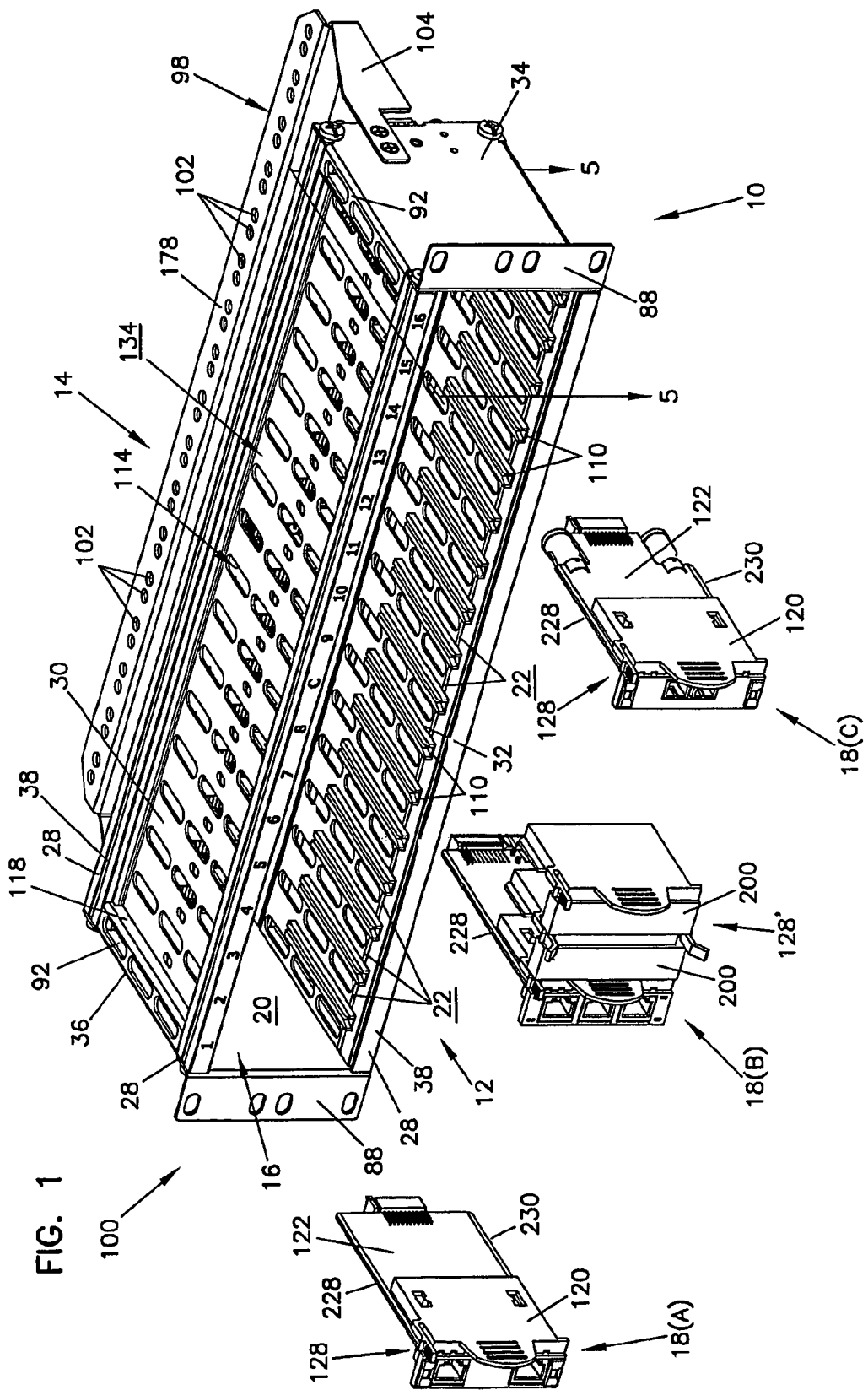
FIG. 1 is a perspective view of a chassis, and shows multiple embodiments of modules, according to the principles of the present disclosure.

FIG. 1 illustrates a chassis 10 having features that are examples of how inventive aspects in accordance with the principles of the present disclosure may be practiced. The chassis 10 has a front 12 and a back 14. The front 12 defines a front opening 16 configured for receipt of the plurality of modules 18. For clarity, only three modules 18(A)-18(C) are shown in FIG. 1. In the illustrated embodiment, the front opening 16 is sized to receive seventeen modules. In particular, the chassis 10 has an interior 20 defining seventeen compartments 22, each compartment 22 configured to receive one module 18. In an alternative embodiment, the chassis may be configured with more or less than seventeen compartments to receive a corresponding number of modules.

The modules 18 are positionable in the compartments 22 of the interior 20 of the chassis 10. The modules 18 are inserted within the interior 20 of the chassis from the front opening 16 toward the back 14. When inserted, the modules 18 interconnect to a printed circuit board 24 (FIG. 2) located at the back 14 of the chassis 10.

Figure 2:
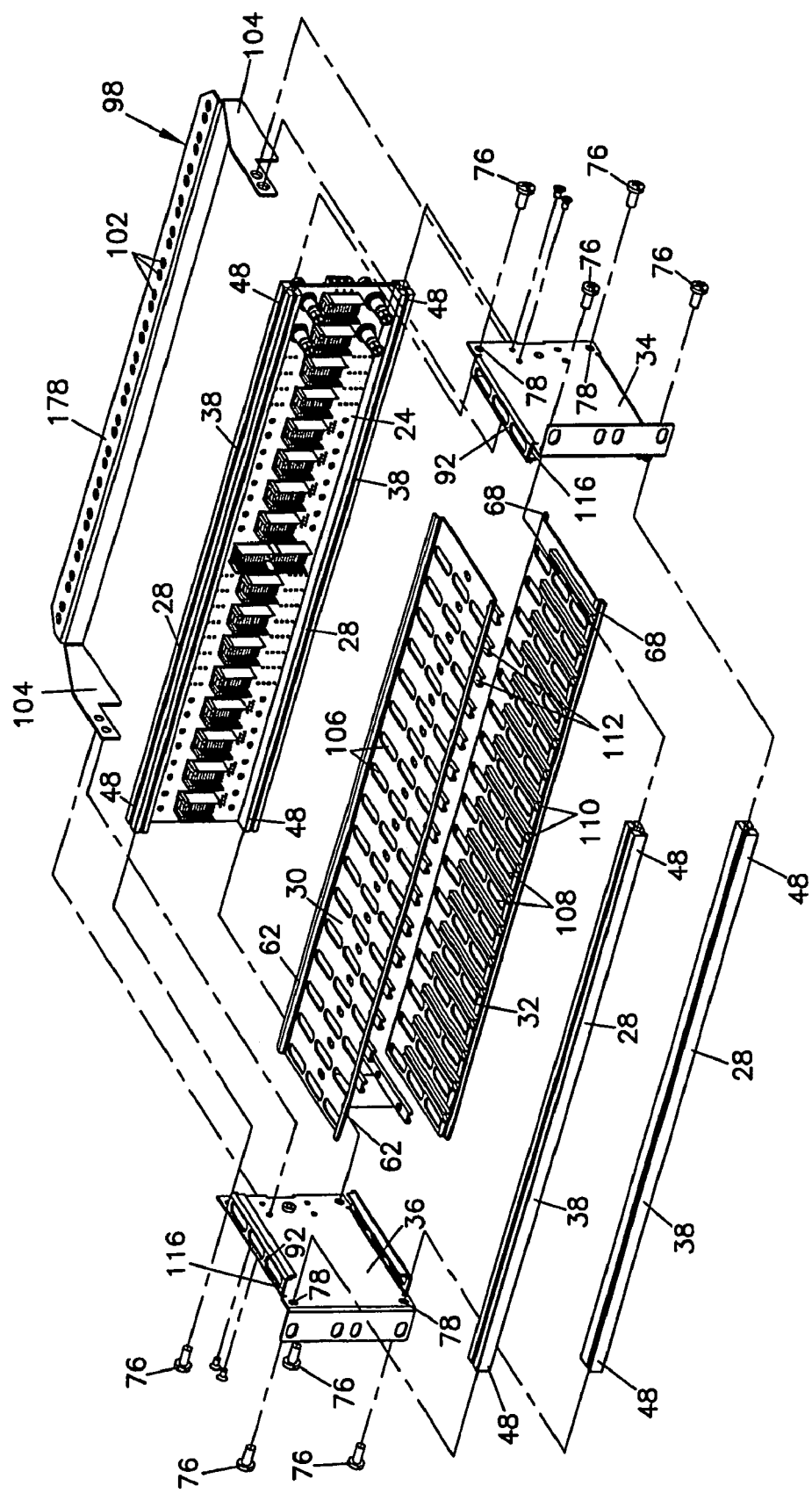
FIG. 2 is an exploded view of the chassis of FIG. 1.

One feature of the chassis 10 relates to the mechanical method deployed in the construction and assembly of the chassis 10. Referring to FIG. 2, the chassis 10 generally includes a plurality of chassis structures 28 (i.e. four chassis structures 28), a top plate 30, a bottom plate 32, and side plates 34, 36.

The chassis structures 28 are generally elongated members or bars 38 that extend along the length of the chassis and define the corners or outer edges 40 (FIG. 5) of the chassis 10. The structures 28 function as rigid stabilizers or rigid corner elements that structurally define the chassis 10 and interconnect each of the top and bottom plates 30, 32 and the side plates 34, 36. In one embodiment, the structures 28 are extruded aluminum bars, although other materials and methods of manufacture may be used to construct the structures 28 in accord with the principles disclosed.

Referring now to FIGS. 3 and 4, the chassis structures 28 include an interconnecting arrangement 26. The interconnecting arrangement 26 is multi-functional in that the arrangement 26 secures the top and bottom plates 30, 32, printed circuit board 24, and modules 18 together as an assembled system. The interconnecting arrangement 26 includes a plurality of channels or slots, including at least a first slot 44 and a second slot 46 extending between ends 48 of the chassis structure 28. The first slot 44 is located on a first side 50 of the structure 28, and the second slot 48 is located on a second side 52. The second side 52 is generally perpendicular to the first side 50.

Referring now to FIG. 5, the top plate (i.e. first cover or top portion) 30 is interconnected to and contained between first and second chassis structures 28a, 28b. In particular, flanges 62 formed along forward and rearward edges 64, 66 of the top plate 30 are positioned within the first slots 44 of the first and second chassis structures 28a, 28b. Likewise, the bottom plate (i.e. second cover or bottom portion) 32 is interconnected to and contained between third and fourth chassis structures 28c, 28d. That is, flanges 68 formed along forward and rearward edges 70, 72 of the bottom plate 32 are positioned within the first slots 44 of the third and fourth chassis structures 28c, 28d.

Referring back to FIG. 4, a hole 74 formed at each of the ends 48 of the chassis structure 28. In the illustrated embodiment, each of the chassis structures 28 is an extrusion, and the hole 74 is formed along the length of each extruded structure 28. In an alternative embodiment, holes may be formed only at the ends of the structure rather than extend along the entire length of the structure.

As shown in FIG. 2, the side plates (i.e. end covers or end portions) 34, 36 are connected to the ends 48 of chassis structures 28. In particular, fasteners 76 are inserted through holes 78 formed in the side plates 34, 36 and engage the hole 74 formed in the ends 48 of each of the chassis structures 28. In the illustrated embodiment, the fasteners 76 are self-tapping fasteners that self-thread into the extruded hole 74. In other embodiments, threads may be machined or pre-formed at the ends 48 of the chassis structure 28 for use with other types of fasteners.

Referring to FIGS. 2 and 5, the second slot 46 of the chassis structure 28 can be used to retain the printed circuit board 24. This design eliminates the need for fasteners to secure the printed circuit board to the chassis 10. As shown in FIG. 5, the second slot 46 is sized and configured for receipt of top and bottom edges 80, 82 of the printed circuit board 24. When assembled, the edges 80, 82 of the printed circuit board 24 engage the second slots 46 of the second and fourth chassis structures 28b, 28c.

Still referring to FIG. 5, the second slots 46 of the chassis structures can also be used to retain the modules 18 within the interior 20 of the chassis 10. That is, the second slot 46 is sized and configured for of receipt first and/or second flexible tabs 84, 86 of the modules 18. When assembled, the first and second flexible tabs 84, 86 of the modules 18 engage the second slots 46 of the first and third chassis structures 28a, 28d.

By this arrangement, each of the first and second slots 44, 46 of any one of the four chassis structures 28 can be used for multiple functions. For example, the first slot 44 of one chassis structure 28 may be oriented to either engage the forward or rearward edge 64, 66 of the top plate 30; or may be oriented to engage the forward or rearward edge 70, 72 of the bottom plate 32. Accordingly, the one chassis structure 28 may be oriented such that the second slot 46 engages one of the top or bottom edges 80, 82 of the printed circuit board 24; or oriented such that the second slot 46 engages one of the flexible tabs 84, 86 of the module 18. In other words, a particular chassis structure 28 can be used as either an upper chassis structure (e.g. 28a, 28b) or a lower chassis structure (e.g. 28c, 28d); and as either a forward chassis structure (e.g. 28a, 28d) or a rearward chassis structure (e.g. 28b, 28c). By providing chassis structures each having identical structure features arranged to function in multiple ways, costs associate with production of the structures and assembly of the chassis are reduced.

As can be further understood, the design of the chassis 10 and the chassis structures 28 eliminates the number of fasteners, and labor, required for assembly of the chassis 10. In this particular embodiment, eight fasteners 76 are used to define the interior 20 of the chassis 10 (the interior 20 being defined by the top and bottom plates 30, 32, side plates 34, 36, and the printed circuit board 24).

Figure 6:
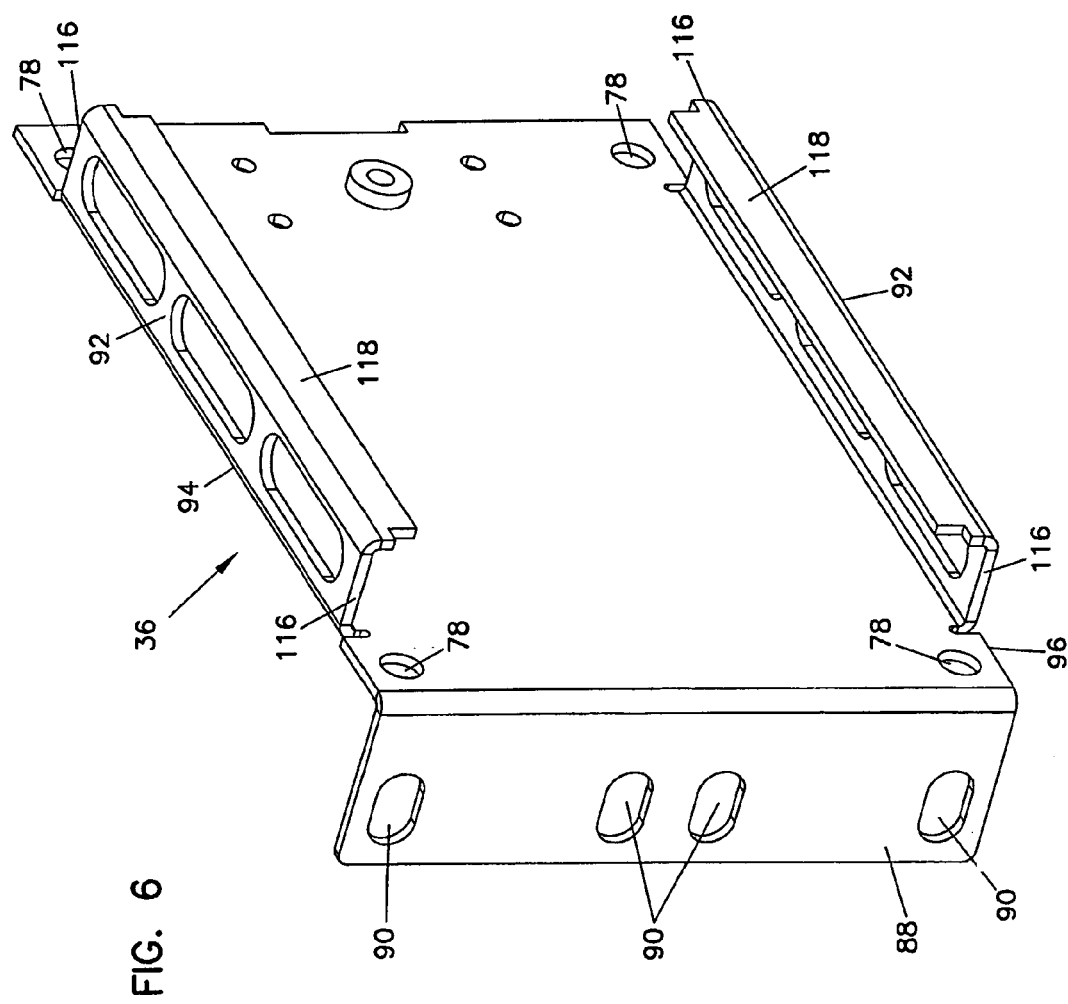
FIG. 6 is a perspective view of a side plate shown in FIG. 2.

Referring back to FIG. 1, the side plates 34, 36 include mounting brackets 88 that extend outward from the chassis 10. The mounting brackets 88 include holes for receipt of fasteners (not shown) that secure the chassis to a frame or rack (not shown). The chassis 10 is configured to mount to standard 19-inch or 23-inch frames or racks, although may be constructed to mount to other sized racks used in industry. Referring to FIG. 6, the side plates also include side extensions 92. The extensions 92 are located at top and bottom edges 94, 96 of the side plates. The extensions 92 project inward toward the opposite side plate of the chassis 10 when assembled. Referring to FIGS. 2 and 6, the extensions 92 have edges 116 that assist in properly locating the chassis structures 28. That is, the chassis structures 28 of the chassis are positioned adjacent to the edges 116 of the extensions 92. When positioned in this manner, the hole 74 of the chassis structure 28 aligns with the corresponding hole 78 of the side plate 36 for receipt of one of the fasteners 76.

Still referring to FIG. 6, each of the extensions 92 includes a lip 118 that offsets the extension from the top and bottom plates 30, 32 of the chassis. The arrangement of the lips 118 provides recessed regions 134 (only one shown, FIG. 1) adjacent to the top and bottom plates 30, 32. The recessed regions 134 may be used for placement of wire mesh or fire screens, for example.

Referring back to FIGS. 1 and 2, the illustrated chassis 10 includes a cable organizer 98 located adjacent to the back 14 of the chassis. The cable organizer 98 includes an angled or L-shaped portion 178 having a plurality of apertures 102 to which cable ties may be secured for organizing and securing cables. The angled portion 178 is coupled to the chassis 10 by arms 104. The arms 104 fasten to the side plates 34, 36 of the chassis 10.

In the illustrated embodiment, the chassis 10 includes ventilation structure 114 for ventilating the interior 20 of the chassis 10. In the illustrated embodiment, the ventilation structure 114 includes a plurality of elgongated apertures 106, 108 (FIG. 2) formed in each of the top and bottom plates 30, 32. The elongated apertures 106 of the top plate 30 are generally aligned with the elongated apertures 108 of the bottom plates 32 when the chassis 10 is assembled; and each of the elongated apertures 106, 108 is aligned with a compartment 22 of the chassis 10. The apertures 106, 108 provide ventilation to the modules 18 when the module 18 is inserted within the compartments 22 of the chassis 10.

As shown in FIG. 2, guides 110, 112 are located adjacent to the top and bottom plates 30, 32 of the chassis. Each pair of guides, i.e. one top and one bottom guide 110, 112, is associated with one of the compartments 22 of the chassis 10. The pairs of guides 110, 112 are arranged to guide and receive one of the modules 18.

II. Module

Figure 7:
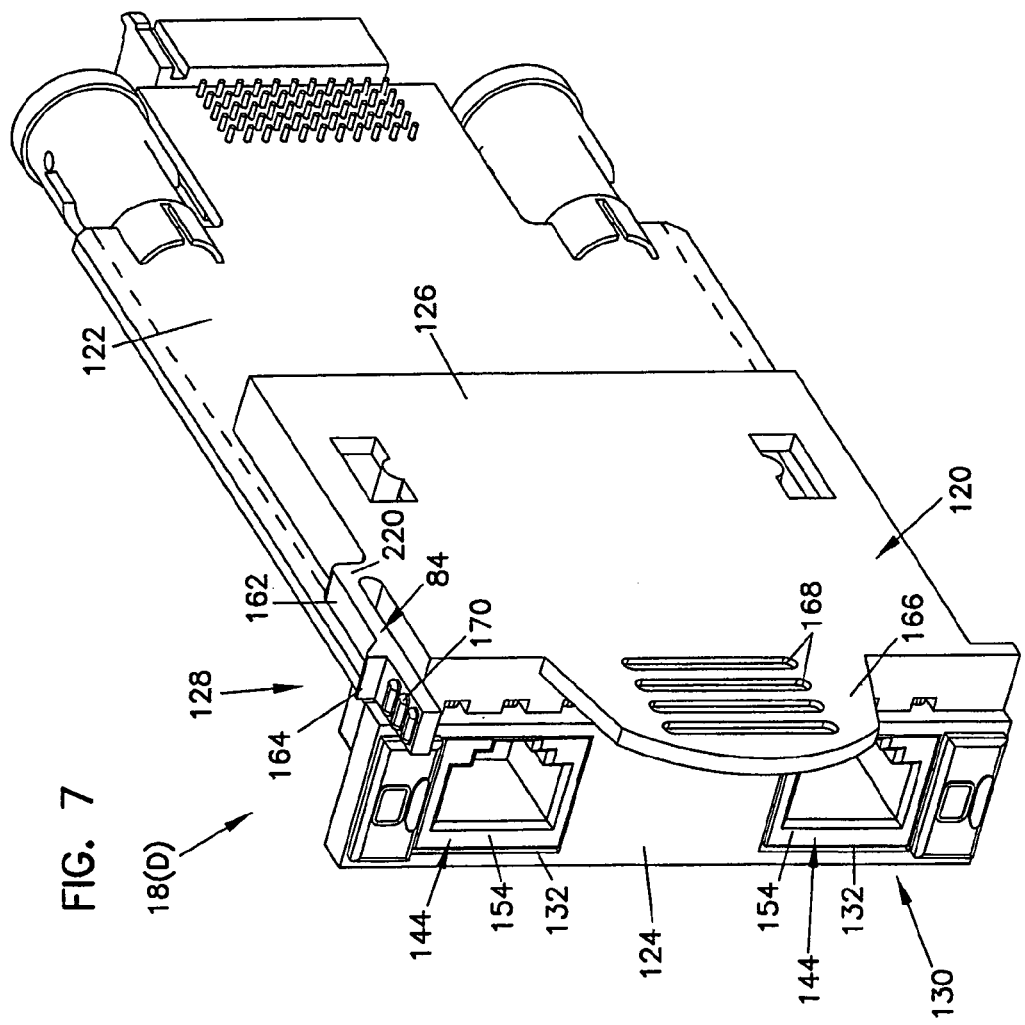
FIG. 7 is a perspective view of yet another embodiment of a module having a module card and housing, and shows a first embodiment of a securing arrangement, according to the principles of the present disclosure.

Referring now to FIG. 7, one embodiment of the module 18 configured for use with the chassis 10 is illustrated. The module 18 generally includes a housing 120 and a module card 122. As will be discussed in greater detail, the housing 120 and card 122 are configured to provide an interface between an incoming element and an outgoing element. The incoming and outgoing elements may include a variety of element configurations, including cables, patch plugs or patch cords, or other communication configurations. Further, each of the element configurations may include a variety of configuration types, such as copper, and/or optical element configuration types. What is meant by incoming is that the element couples to the chassis 10 at the front 12, i.e. the element couples or interconnects to the module 18. What is meant by outgoing is that the element couples to the chassis 10 at the back 14, i.e. that element couples to or terminates at the back plane 150. "Incoming" and "outgoing" are not intended to imply a communication flow of a signal. That is, incoming does not necessarily mean that the element only provides an input and outgoing does not necessarily mean that the element only receives an output.

In general, the module 18 includes at least one front face connector 144 and an interface connector 146. The face connector 144 is configured to receive an incoming element. The outgoing elements are typically terminated at back plane connectors 148 (FIG. 19) located on a back plane 150 of the chassis 10. The back plane 150 of the chassis 10 in the illustrated embodiment is defined by the printed circuit board 24. The incoming and interface connectors 144, 146 are electronically connected to the card 122 and provide electrical communication between the incoming elements and the outgoing elements terminated at the back plane connectors 148 of the system 100.

Still referring to FIG. 7, one embodiment of the housing 120 of the module 18 is illustrated. The housing 120 is generally L-shaped and includes a face plate 124, a housing side or card retaining structure 126, and a securing arrangement 128. The face place 124 is generally oriented perpendicular to the card retaining structure 126. When assembled with the card 122, the face plate 124 is oriented generally perpendicular to the card 122, and the card retaining structure 126 is oriented generally parallel to the card 122. In one embodiment, the housing 120 is a molded construction. Other methods of manufacturing the housing in accord with the principles disclosed are contemplated.

Figure 14:
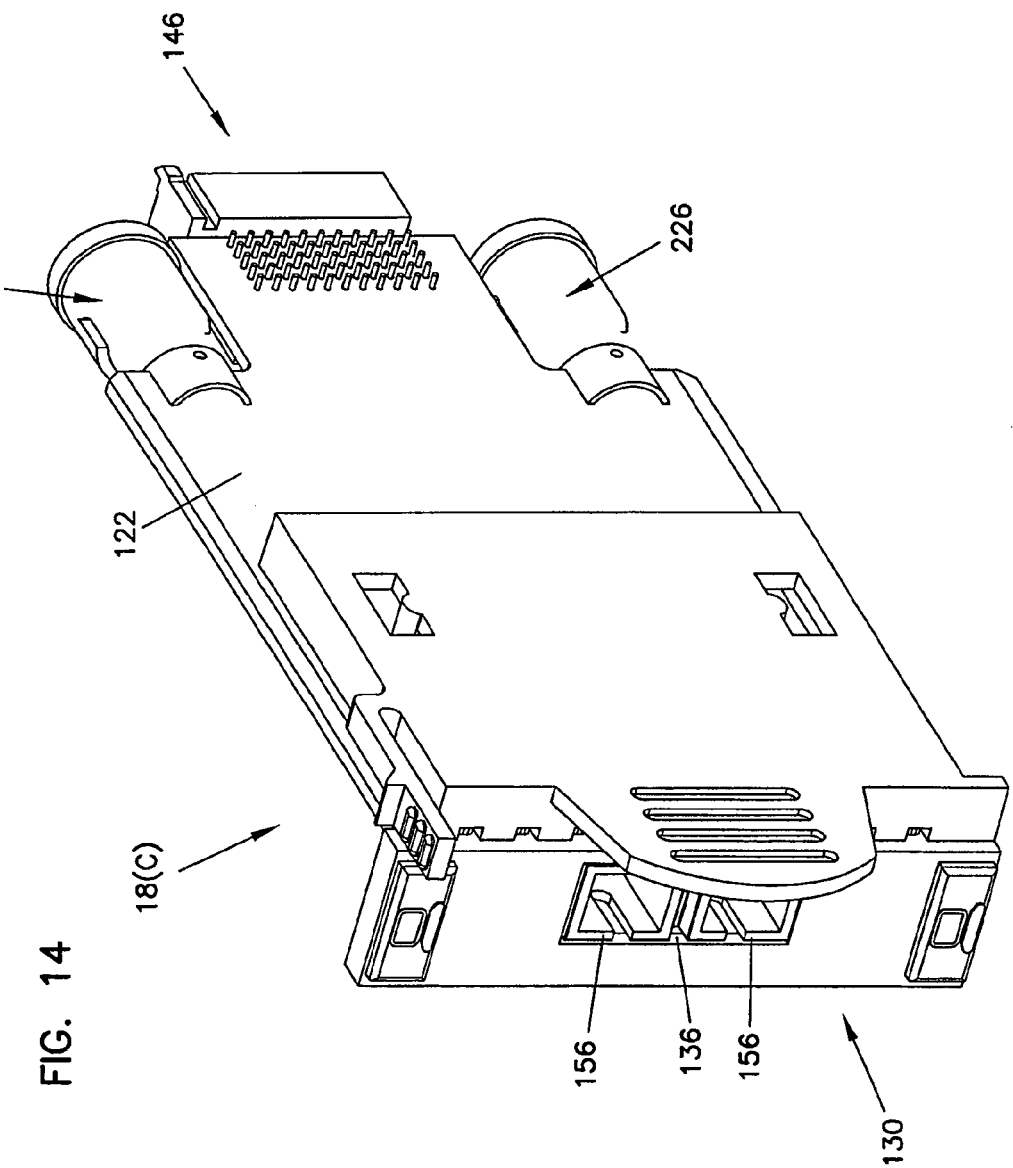
FIG. 14 is a perspective view of another of the multiple module embodiments of FIG. 1.
Figure 17:
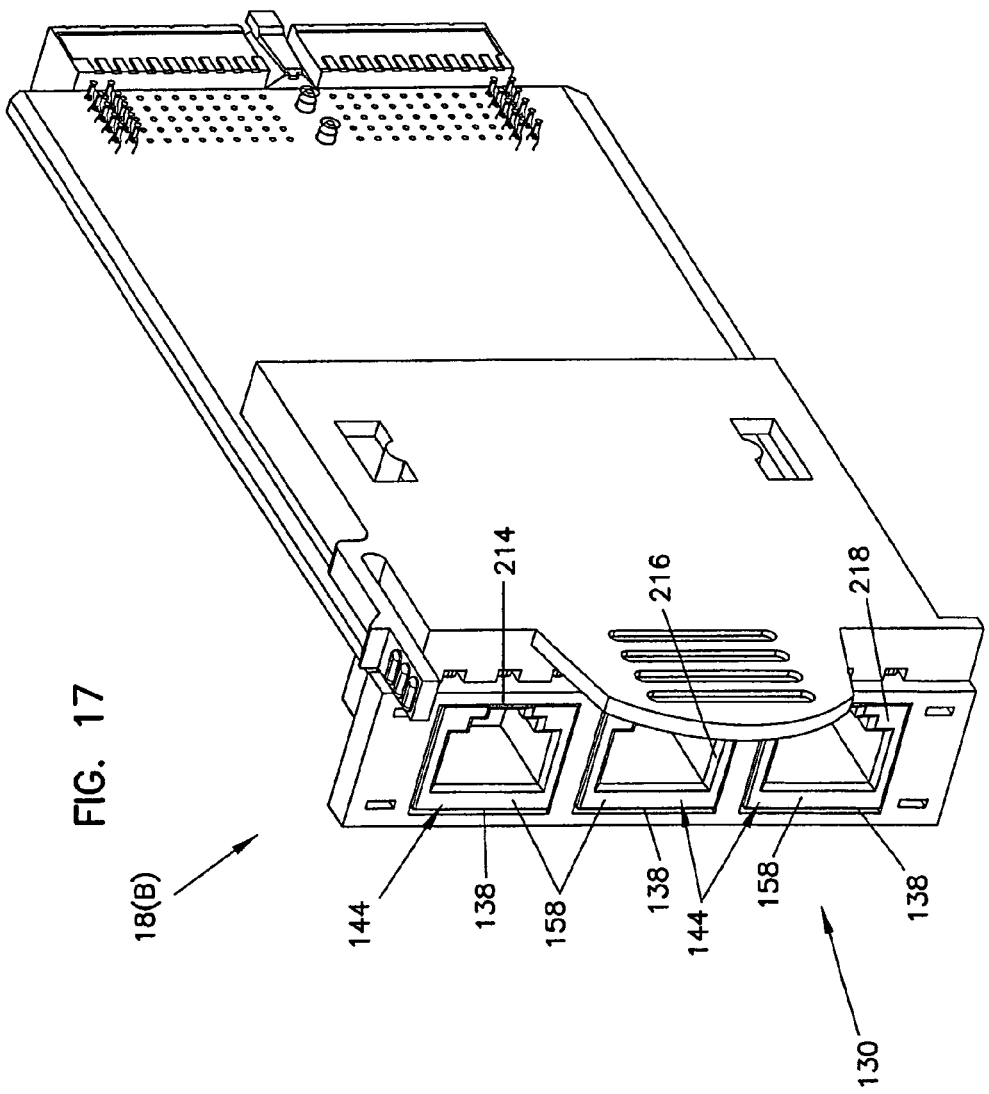
FIG. 17 is a perspective view of still another of the module embodiments of FIG. 1.

The face plate 124 includes an aperture or window arrangement 130. In the illustrated embodiment of FIG. 7, the window arrangement 130 includes two windows 132 corresponding to a particular configuration of the card 122 (i.e. corresponding to the configuration and type of incoming element and associate face connectors 144). In alternative embodiments, the window arrangement 130 may include a different number, size, or orientation of windows formed in the face plate 124 for use with other card configurations. For example, FIG. 14 illustrates a window arrangement 130 having a single window 136 sized and configured to correspond to another card configuration (e.g. a configuration related to incoming optical elements). FIG. 17 illustrates a window arrangement 130 having three windows 138 configured to correspond to yet another card configuration (e.g. a configuration related to an incoming Ethernet element).

Figure 8:
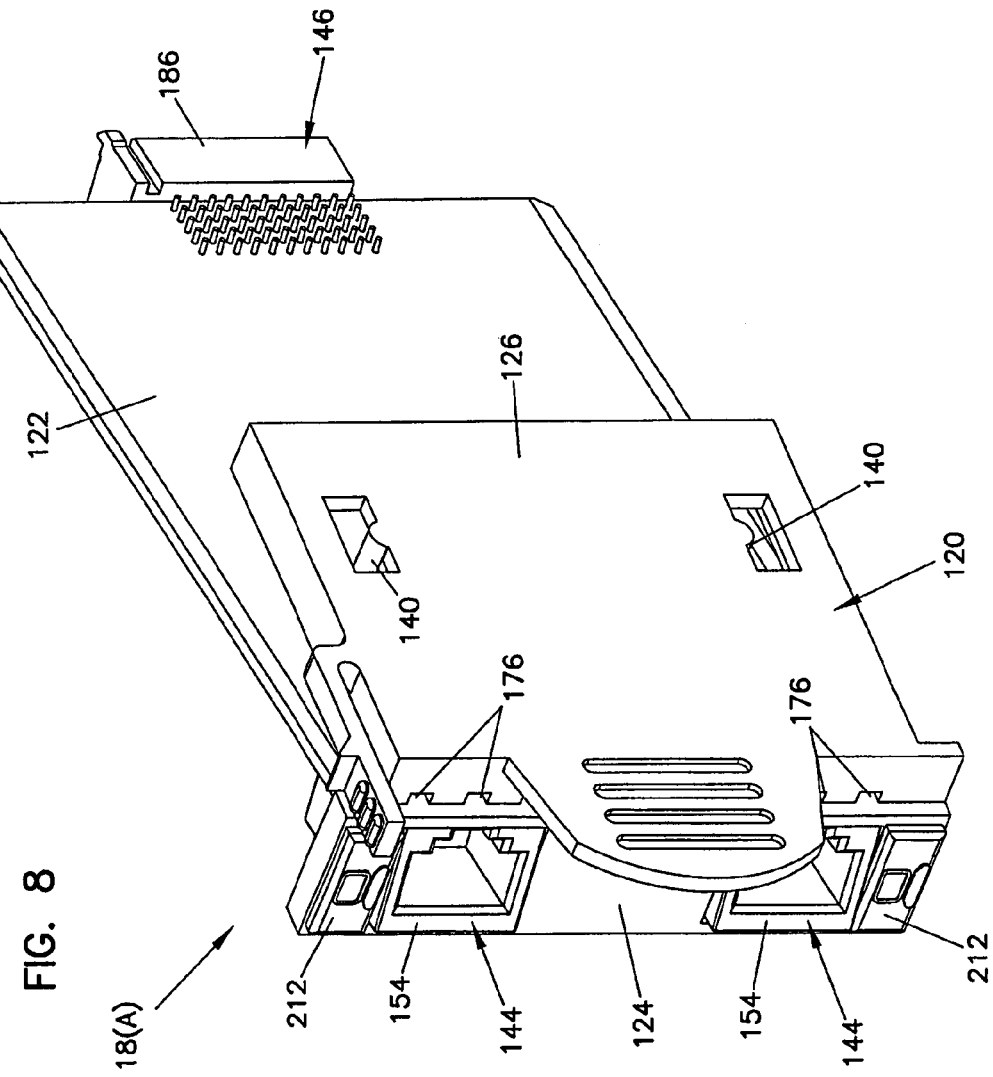
FIG. 8 is a perspective view of one of the multiple module embodiments of FIG. 1, having a module card and housing, and shown with the module card and housing partially assembled.

Referring now to FIGS. 8-10, the card retaining structure 126 of the housing 120 includes latches 140 that interlock with holes 142 formed in the card 122. Preferably, the card retaining structure 126 is designed such that the card 122 snap-fits to the housing 120; that is, the latches 140 can be flexed to attach the card 122 to the housing 120. In particular, to assembly the module 18, the card 122 is positioned such that the face connectors 144 are located adjacent to the window arrangement 130 of the housing 120 (FIGS. 8 and 9). The card 122 and the card retaining structure 126 of the housing 120 are then pressed together so that the latches 140 engage the holes 142 formed in the card 122 (FIG. 10). The card 122 can also be removed from the housing 120 by flexing the latches 140 toward one another and tilting and lifting card 122 from the housing 120. This arrangement provides a module assembly that requires no fasteners, thereby reducing assembly time and costs associated with conventional arrangements. In an alternative arrangement, the latches or other latching members may be formed on the card and holes formed in the housing to provide a similar snap-fit connection.

Referring back to FIG. 8, openings 176 are formed between the face plate 124 and the card retaining structure 126. The openings 176 may be located adjacent opposite ends 208, 210 of the housing 120 (FIG. 14) or may extend along the entire length of the housing between the opposite ends. The openings are provided for visual observance of LEDs (not shown) that may be operably placed on the card 122 of the module 18. In use, an operator can monitor operation of a particular module 18 by visually inspecting an LED through the opening 176 of the module housing 120.

Figure 23:
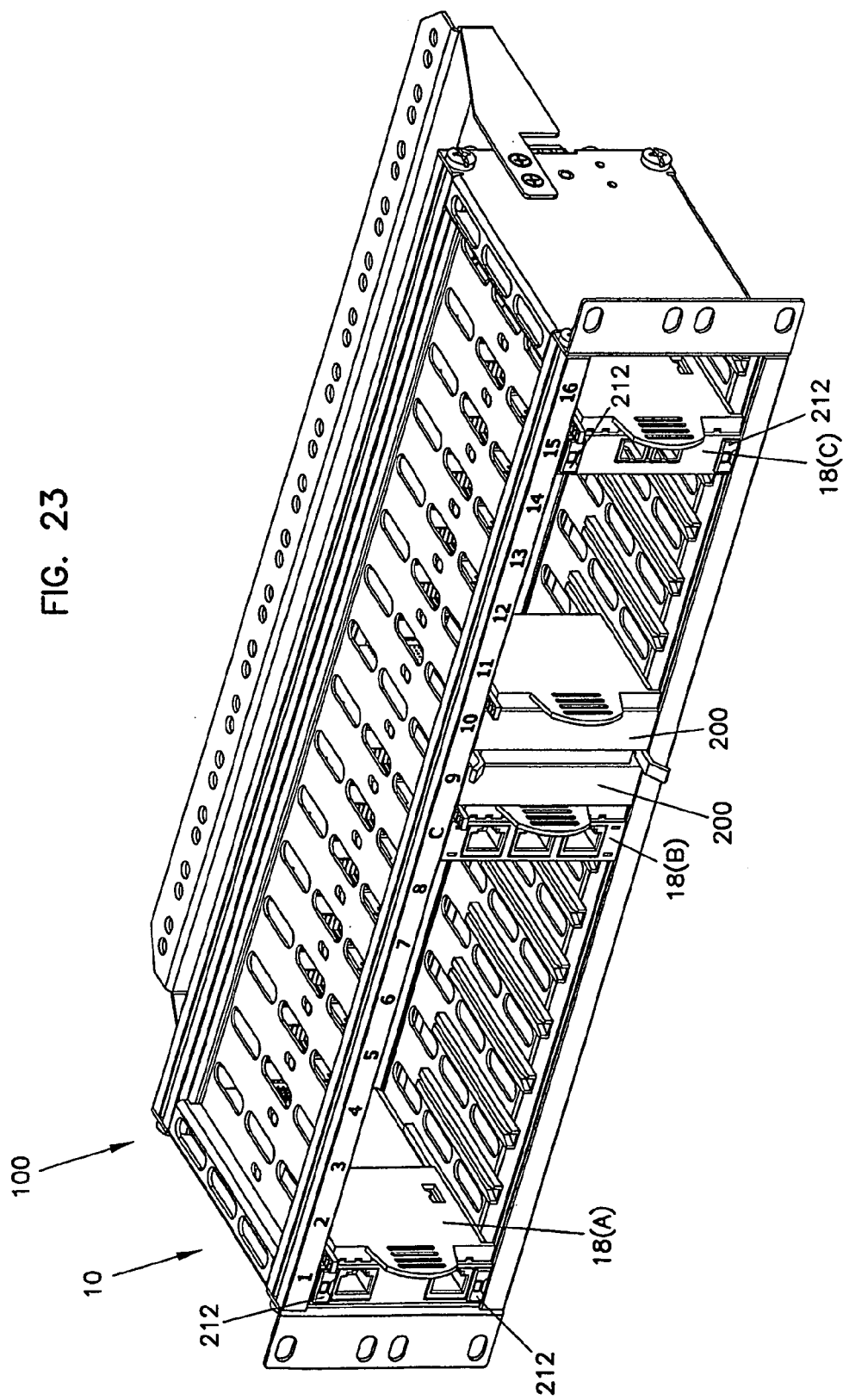
FIG. 23 is a perspective view of the chassis of FIG. 1, shown with the multiple module embodiments inserted within the chassis.

Referring to FIGS. 8 and 11, icons or labels 212 can be placed on the face plate 124 of the housing 120. As shown in FIG. 23, the labels 212 can be used for marking or identifying particular modules 18 or incoming elements.

Referring back to FIG. 1, the securing arrangements 128 of the modules 18 are configured to removeably mount the modules within the chassis 10. In a first embodiment shown in FIG. 7, the securing arrangement 128 is defined by the first flexible tab 84. The first tab 84 includes an extension portion 162 joined at an end 220 to the card retaining structure 126. A projection 164 extends upward from the extension portion 162 and is arranged to engage the second slot 46 of the chassis structure 28a (FIG. 5). The first tab 84 is configured to flex so that the tab 84 can be pressed downward to insert or remove the module 18 from the chassis 10.

Still referring to FIG. 7, a handle portion 166 extends forward from the card retaining structure 126. The handle portion 166 is used to maneuver the card module. In the illustrated embodiment, the handle portion 166 includes ribs 168. The ribs 168 provide a gripping surface to aid in removing the module 18 from the chassis 10. When removing the module 18 from the chassis 10, the first tab 84 is flexed downward and the module is pulled out of the chassis by the handle portion 166. In an alternative embodiment, an aperture (not shown) may be formed in the handle portion 166 so that an operator can place a finger(s) through the aperture and pull the module 18 from the chassis 10. Ribs 170 are also formed on the first tab 84 to assist in gripping the module 18.

Figure 13:
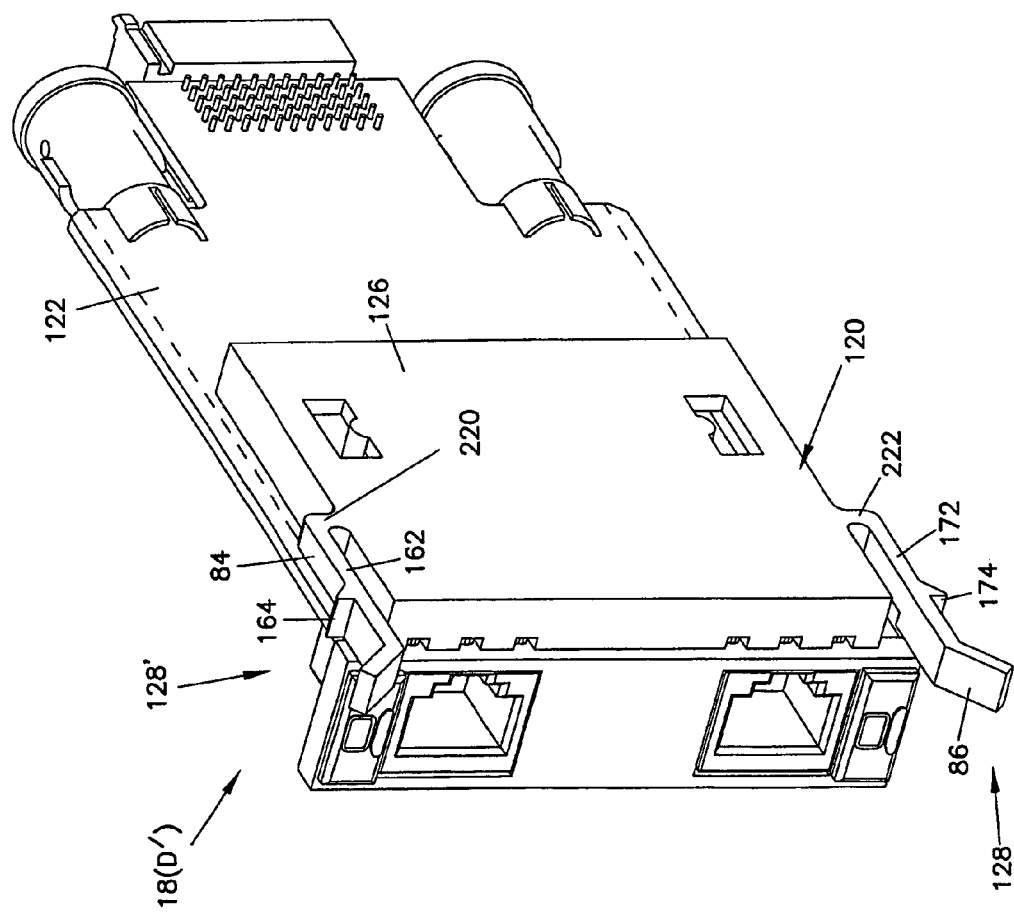
FIG. 13 is a perspective view of the module similar to FIG. 7, shown with a second embodiment of a securing arrangement.

Referring now to FIG. 13, a second embodiment of a securing arrangement 128' is illustrated. In this embodiment, the securing arrangement 128' is defined by the first flexible tab 84, and the second flexible tab 86. Similar to the first tab 84, the second flexible tab 86 also includes an extension portion 172 joined at an end 222 to the card retaining structure 126. A projection 174 extends outward from the extension portion 172. The projections 164, 174 of the first and second tabs 84, 86 are arranged to engage the second slots 46 of the first and third chassis structures 28a, 28d (partially shown in FIG. 5). The tabs 84, 86 are configured to flex so that the tab 84, 86 can be pressed toward one another to insert and remove the module 18 from the chassis 10. In the second securing arrangement embodiment 128', a handle portion is not present. To remove the module 18 from the chassis 20, the tabs 84, 86 are simply flexed toward one another to disengage the projections 164, 174 from the second slots 46 of the chassis structures 28a, 28d, and the module 18 is pulled out of the chassis 10 by the tabs 84, 86.

Figure 22:
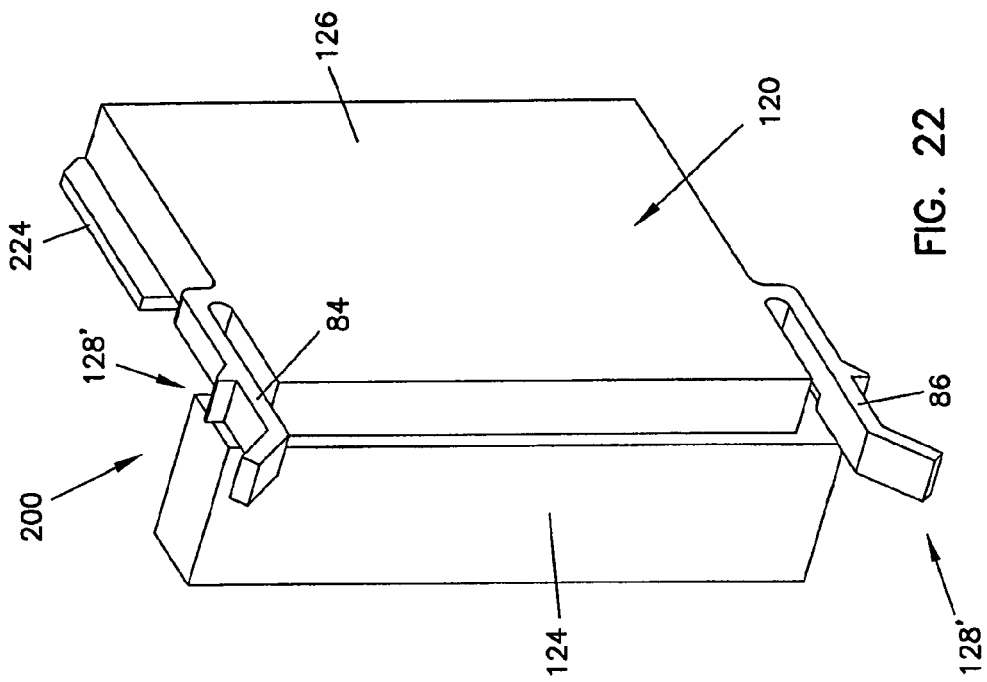
FIG. 22 is a perspective view of another embodiment of a blank shown in FIG. 1.
Figure 21:
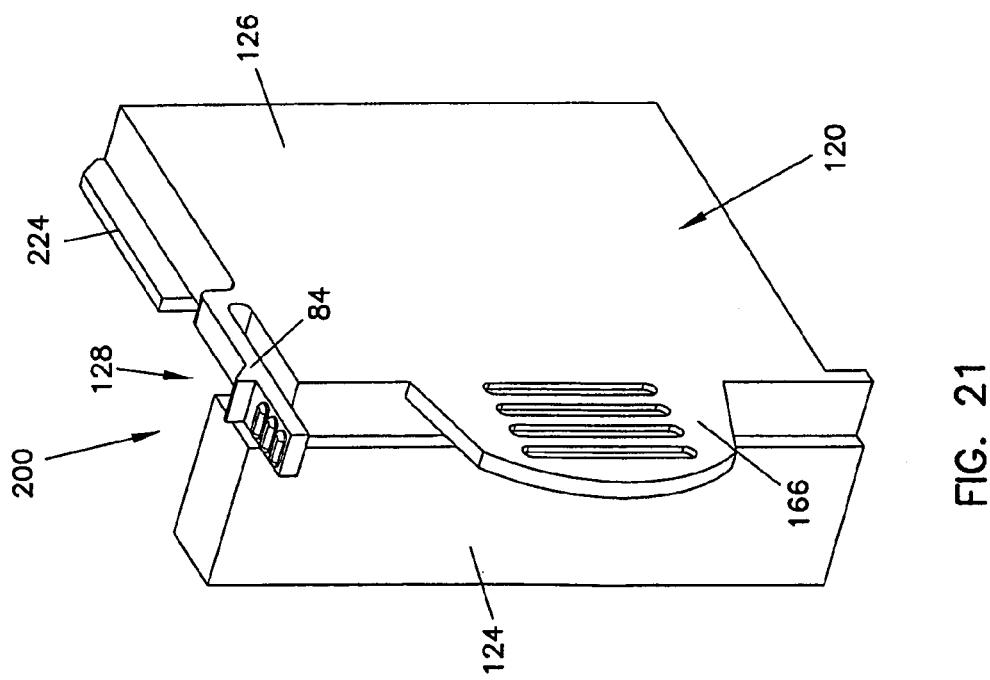
FIG. 21 is a perspective view of one embodiment of a blank shown in FIG. 1.

Referring back to FIGS. 1 and 23, the modules 18 are inserted with the compartments 22 of the chassis 10 by sliding top and bottom edges 228, 230 of the card 122 with the guides 110, 112. In applications where not all compartments 22 are utilized, blanks 200 may be inserted within the chassis 10. As shown in FIGS. 21 and 22, blanks 200 are essentially housings 120 without a window arrangement formed in the face plate 124, and without LED openings 176. The blanks 200 include rails 224 located adjacent to the retaining structure 126 of the housing 120 (only a top rail is shown). The rails 224 simulate a card (122) and slide within the guides 110, 112 of the chassis 10 to assist in positioning the blank 200.

FIG. 21 illustrates a first blank 200 having the first securing arrangement 128 embodiment with the handle portion 166, as previously described. FIG. 22 illustrates a second blank 200 having the second securing arrangement embodiment 128' with first and second tabs 84, 86, as previously described. When inserted within the compartments 22 of the chassis 10, the blanks 200 cover the front opening 16 so that the interior 20 of the chassis 10 is enclosed. Enclosing the interior 20 with the blanks 200 protects the modules 18 (i.e. the housings 120 interconnected to cards 122) from dust and particulate contamination.

III. Multi-Interface System

The module 18 of the present disclosure is configured to be a multi-interface platform design that interfaces with a number of incoming elements and outgoing elements. What is meant by incoming elements are elements or components, from other equipment, that couple or connect to the module. As previously described, incoming elements can include, for example, patch cords having RJ-45 type connectors, Ethernet connectors, or optical connectors. Likewise, what is meant by outgoing elements are elements or components, going to other equipment, that couple or connect to the back plane 150 of the chassis 10. As previously described, outgoing elements can include, for example, patch cords having RJ-45 type connectors, coax cables, or patch cords having optical connectors.

A number of the module embodiments having different face connectors are illustrated. For example, FIG. 7 shows a module 18(D) having face connectors 144 that are RJ-45 type connectors 154. FIG. 14 shows a module 8(C) configured with incoming optical connectors 156, such as SC-type connectors. Alternatively, the face connectors 144 of the module 18(B) in FIG. 17 include three RJ-45 face connectors 158 for use in applications that require an Ethernet connection or a monitoring connection.

In the same manner, the back plane 150 may incorporate multiple types of back plane connectors 148. In the illustrated embodiment of FIG. 19, the back plane 150 has a variety of back plane connectors 148 including coax connectors 180, punch-down connectors 182 (i.e. insulation displacement connectors), and RJ-45 connectors 184. In addition, the back plane connector 148 may include a 110-connector or an optical connector 232 (represented schematically in FIG. 24). The back plane 150 can be configured with a combination of the back plane connector types (e.g. 180, 182, 184) or may configured with only a single back plane connector type. In use, some or all of the back plane connectors 148 of the back plane 150 may be pre-wire with cables prior to inserting or placing any modules 18 within the compartments 22 of the chassis 10 to ease assembly and installation of an entire system.

The interface connector 146 (FIG. 5) of the system 100 provides electrical communication between the card 122 and the printed circuit board 24, and accordingly the face connectors 144 and the back plane connectors 148. In the illustrated embodiment, the interface connector 146 is a card edge connector having a first connector piece 186 (FIG. 8, for example) coupled to the card 122, and a second connector piece 188 (FIG. 18). The second connector piece 188 of the interface connector 146 is mounted to an interface plane 190 of the printed circuit board 24. Each of the second connector pieces 188 is associated with one of the back plane connectors 148 located on the back plane 150 of the chassis 10.

As previously discussed, the modules 18 are designed to provide a variety of incoming and outgoing interconnection options. In addition, the module 18 can also be configured as either a passive module or an active module. In a passive module configuration, power is not required because an incoming signal is either simply passed, without signal modification, from the face connector to the back plane connector, or passed between two face connectors in a loop-like configuration.

Figure 20:
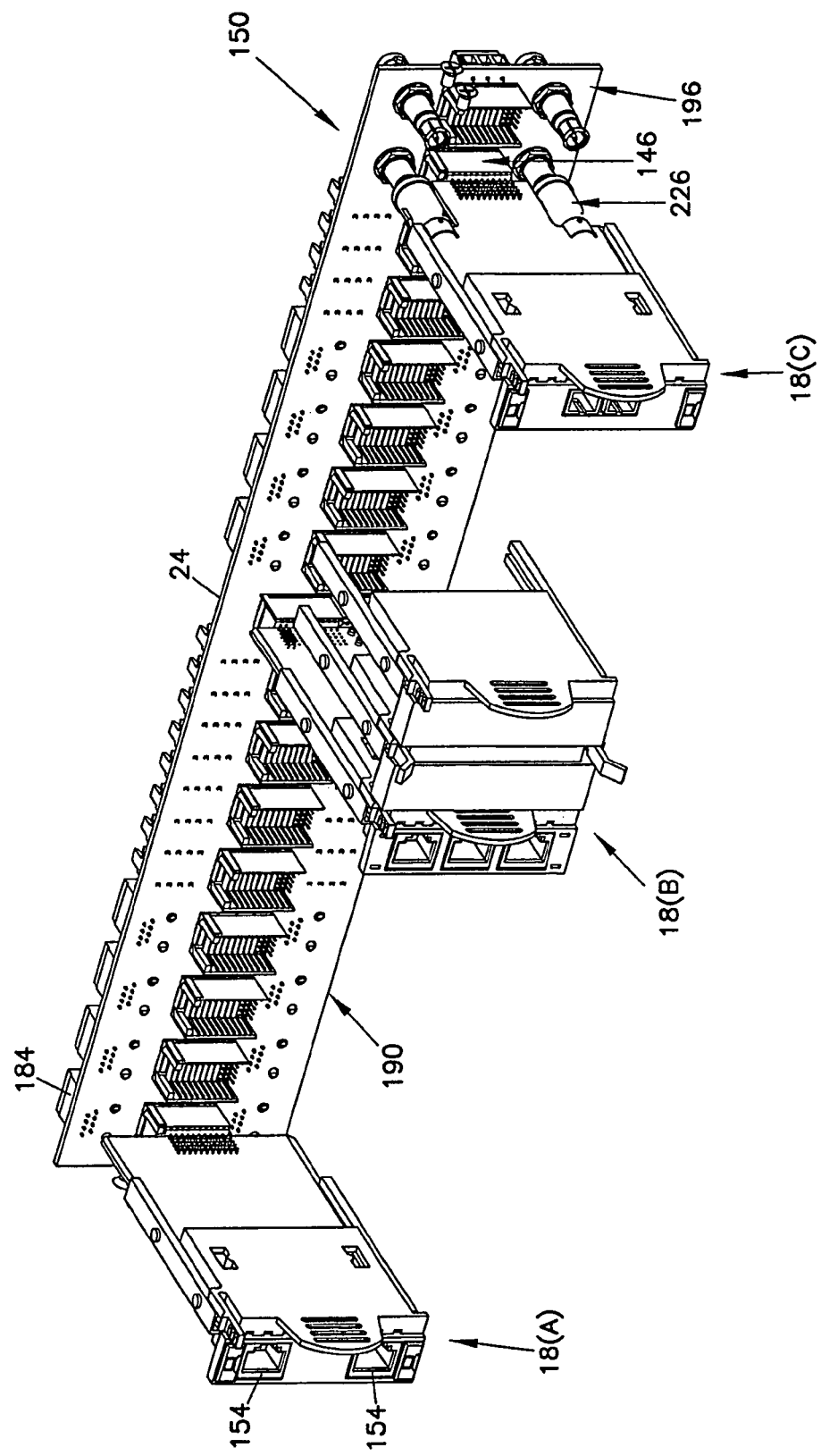
FIG. 20 is a front perspective view of the printed circuit board of FIG. 18, shown with the multiple module embodiments of FIG. 1.

The module 18(A) illustrated in FIG. 8 can be configured as a passive module. In a passive configuration, two standard incoming RJ-45 connectors 154 are used to interconnect to outgoing RJ-45 connectors 184 (FIGS. 19 and 20). Only data information is transmitted. Other passive module configurations may include cards 122 having semi-conductors to provide GR-1089 Intra-Office Lighting Protection, or make-before-break connections designed for high reliability. In yet another configuration, the face connectors 144 of the passive module may be interconnect with one another through tracings on the card 122. By interconnecting the face connectors 144, the passive module can operate in a normal pass-through mode or a patching mode.

In an active module configuration, power is required to modify, monitor, or otherwise interact with the incoming signal. Referring to FIG. 19, the back plane 150 defined by the printed circuit board 24 includes at least one power input 192. The back plane 150 is illustrated with four power inputs, however most applications use only two power inputs. Four power inputs 192 are shown to illustrate the typical locations of the power inputs 192. In particular, the printed circuit board 24 usually has either: one pair of power inputs 192 arranged such that one power input is located at each of the opposite ends of the printed circuit board 24; or one pair of power inputs 192 centrally located on the printed circuit board 24. In the illustrated embodiment, the pair of power inputs 192 are 48 volt DC inputs. Power is transferred from the power inputs 192 through the printed circuit board 24 and to the interface connector 146.

The module 18 receives power from the power input 192 through the interface connector 146. Preferably, the interface connector 146 is configured to accept any passive modules or active modules required by an application. As can be understood, in addition to transferring power, the interface connector 146 is also used to transmit control commands and to transmit signals from the card 122 to the circuit board 24 (i.e. from the incoming element to the outgoing element). In alternative embodiments, some or all of the power transfer, command transmittal, and signal transmittal, may be accomplished through use of card edge pins and card edge contacts.

The module 18(C) illustrated in FIG. 14 is an active module. In this active configuration, the card 122 is used to convert an incoming signal from the incoming optical connectors 156 to an outgoing coax signal (or copper signal). In some applications, power may be injected along with the data signal transmission to power a remote Ethernet application. In this particular arrangement, the module 18(C) includes a second interface connector 226 in addition to the first interface connector 146. Referring to FIGS. 14-16, the second interface connector 226 includes a first coax connector piece 202 interconnected to the card 122. The first coax connector piece 202 couples to a second coax connector piece 204 of a bulkhead arrangement 196 (FIG. 19) to transmit the converted coax signal. As shown in FIGS. 19 and 20, the bulkhead arrangement 196 includes the back plane connector 148 (i.e. includes the outgoing coax connector 180), and the second coax connector piece 204.

In the illustrated embodiment shown in FIG. 14, the first coax connector piece 202 is a female connector piece. A tapered bushing or collar 206 is positioned about the first coax connector piece 202 to assist in guiding and properly interconnecting the first and second coax connector pieces 202, 204. In this particular application, the first interface connector 146 is used only for control transmittal and power transfer. The signal transmittal is provided through the second coax interface connection 226.

In other optical conversion configurations, the module 18(C) can be configured to interface between copper and optical elements for T3-E3 signaling, high definition television signaling, or analog and digital video signaling. Connectors corresponding to the copper elements may include 75-ohm BNC connectors, for example. It is also contemplated that IEEE 1394 type connectors can be used.

Referring back to FIG. 8, the module 18(A) may also be configured as an active module for use in Ethernet applications. For example, in a single density power over Ethernet application, the two standard incoming RJ-45 connectors 154 are not connected to the back plane 150, but with each other in an arrangement to inject power along with the data to power a remote Ethernet appliance. Likewise, in a duel density power over Ethernet application, the two standard incoming RJ-45 connectors 154 are connected to the back plane 150, and with each other in an arrangement to inject power along with the data to power a remote Ethernet appliance. In these applications, data and power are transmitted from the system 100. Further, the module 18 can be configured to mode match in single or dual port Ethernet applications. That is, the card can be configured to allow dissimilar Ethernet protocols (e.g. 100 Mb/second and 1 Gb/second) to communicate with each other.

In the previous description, the modules described are generally signal transmission modules. In some applications, a module configured as a central processor and/or alarm card may be desired. Providing a central processor and/or alarm module, for example, allows an operator to access the system locally or remotely for status or diagnostic functions. The module 18(B) illustrated in FIG. 17 is configured as a central processor or CPU module. The CPU module 18(B) includes three face connectors 144. In general, the first face connector 214 is typically configured as an Ethernet connection. The second and third face connectors 216, 218 are configured respectively as a communication-in connection and a communication-out connection. Referring to FIG. 18, the printed circuit board 24 includes a processor interface connector 194 configured to provide power to and transmit control signals to and from the CPU module 18(B).

Figure 24:
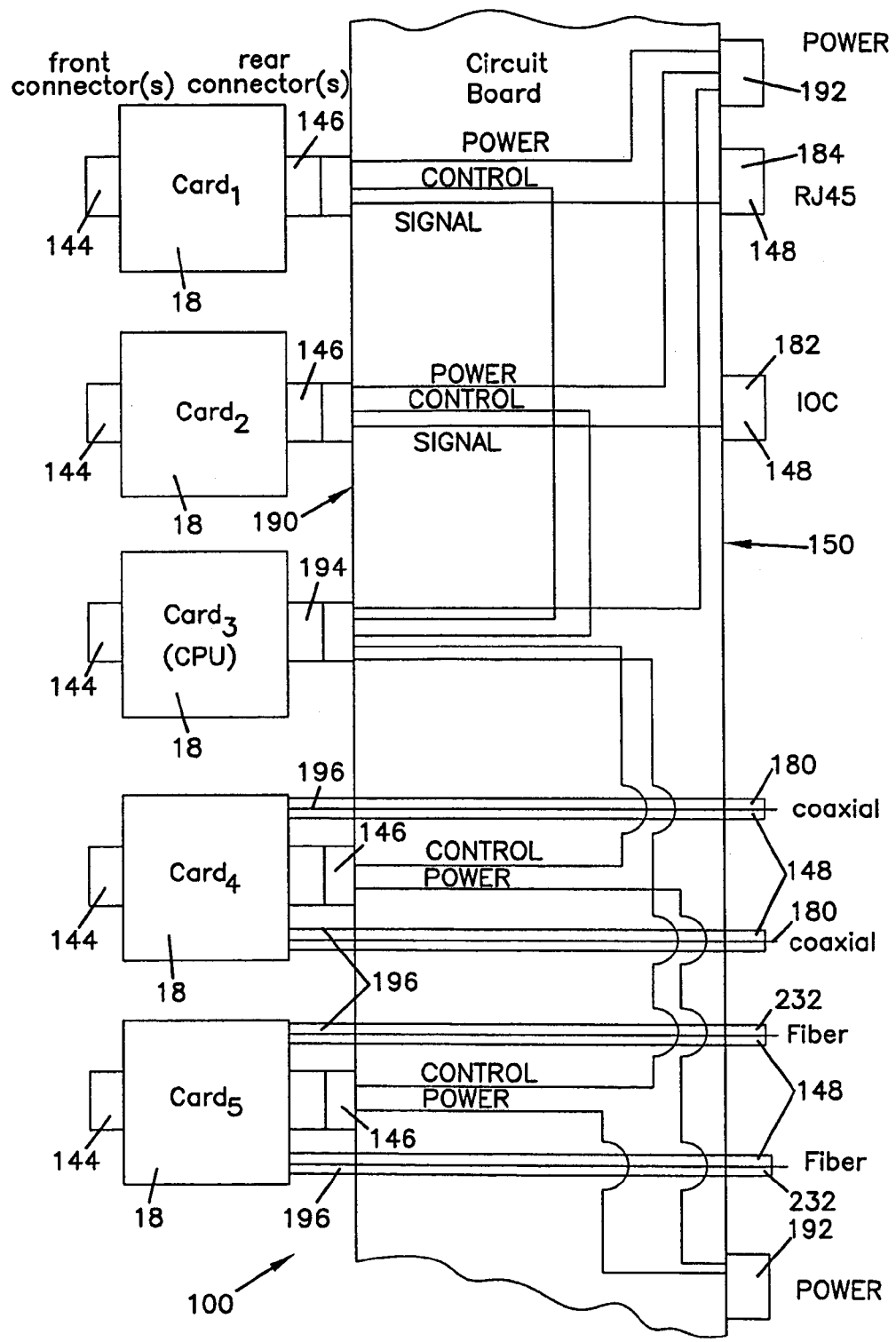
FIG. 24 is a schematic representation of one configuration of a multi-interface patch panel system, according to the principles of the present disclosure.

Referring now to FIG. 24, a general electrical schematic representation of one embodiment of the multi-interface patch panel system 100 is illustrated. As shown, the power input 192 is interconnected to each of the interface connectors 146. Likewise, the printed circuit board provides connections between the control processor interface connector 194 and each of the interface connections 146. By this arrangement, modules 18 having either a passive configuration or an active configuration may be operable positioned within any one of the compartments 22 having an interface connector 146.

As herein disclosed, the multi-interface system of the present disclosure may include a variety of differently configured modules 18. The system is designed to provide significant flexibility for use in a variety of applications.

To illustrate, the back plane 150 of the chassis 10 may include one or a combination of back plane connector types 148 to accommodate a particular system requirement. Likewise, the modules 18 of the system 100 may include a number of face connector types 144. In addition, the modules 18 of the disclosed system 100 may be all passive, all active, or a combination of both. More significantly, a particular module may be originally passive and replaced with an active module at a later time.

For example, a first passive module 18 can be originally used and associated with, for example, a first compartment 22 of the chassis. When the application changes and later requires a signal conversion of an incoming element not initially accepted by the system, the first passive module can be removed and replaced with a second active module to convert the incoming element. The modules are arranged and constructed such that second active module and first passive module are interchangeable within the same compartment. In other words, the system permits operators to mix and match active and passive modules within the same chassis 10, and within the same compartments 22 of the chassis.

Yet another feature of the present disclosure relates to repair of the multi-interface system. Each of the cards 122 of the module 18 is configured with separate power supply components (not shown). In case of a power surge, for example, only the individual damaged modules 18 need to be replaced. Accordingly, because no central power supply is needed, costs associated with supporting a redundant central power supply unit are eliminated. Also, power converters located on the cards 122 are designed to support the particular card only; thereby eliminating large heat generating sources and providing for a high power density associated with the particular card 122.

The multi-interface system 100 of the present disclosure is a platform that provides the advantages of modularizing the available interface options and provides different connection options using a variety of connector types, including both copper and optical. The interface options further include both active and passive and are designed to be field installable and replaceable.

Since many embodiments of the present invention can be made without departing from the spirit and scope of the invention, certain aspects of the invention reside in the claims hereinafter appended.

What is claimed is:

1. A method of assembling a chassis, the method comprising the steps of:
   a) providing four identical chassis structures including a pair of first chassis structures and a pair of second chassis structures, and further providing a first cover, a second cover, and end covers;
   b) positioning the pair of first chassis structures on edges of the first cover;
   c) positioning the pair of second chassis structures on edges of the second cover;
   d) securing one end cover to first ends of each of the chassis structures;
   e) securing another end cover to second ends of each of the chassis structures,
   wherein the first cover, the second cover, and the end covers define a chassis interior configured for receipt of modules;
   f) inserting modules into the chassis interior; and
   g) securing the modules within the chassis interior by engaging a tab carried by each module with retaining structure of one of the chassis structures.

2. The method of claim 1, wherein the steps of securing one end cover and securing another end cover to the ends of the chassis structures includes fastening the end covers to the chassis structures with fasteners.

3. The method of claim 1, wherein the first and second covers are captured between the respective pairs of first and second chassis structures by positioning the edges of each of the covers in a slot formed in each of the chassis structures.

4. The method of claim 3, wherein the slot formed in each of the chassis structures is a first slot, each of the chassis structures further including a second slot that defines the retaining structure, the method further including the step of positioning a printed circuit board in the second slot of one chassis structure of the pair of first chassis structures and in the second slot of another chassis structure of the pair of second chassis structures.

5. The method of claim 3, wherein the slot formed in each of the chassis structures is a first slot, each of the chassis structures further including a second slot that defines the retaining structure.

6. A method of assembling a chassis, the method comprising the steps of:
   a) providing four identical elongated members, a plurality of covers, and a back plane, each of the elongated members having first retaining structure and second retaining structure;
   b) inserting edges of the covers into the first retaining structure of the identical elongated members, including:
      i) inserting edges of a first cover into the first retaining structure of one forward elongated member and one rearward elongated member; and
      ii) inserting edges of a second opposite cover into the first retaining structure of another forward elongated member and another rearward elongated member;
   c) inserting edges of the back plane into the second retaining structure of the rearward elongated members;
   d) inserting modules within a front opening of the chassis, the front opening being defined at least in part by the forward elongated members; and
   e) securing the modules within the front opening of the chassis by engaging a tab carried by each module with the second retaining structure of one of the forward elongated members.

7. The method of claim 6, further including securing end covers to first and second ends of each of the elongated members.

8. The method of claim 7, wherein the step of securing the end covers includes fastening the end covers to the elongated members with fasteners.

9. The method of claim 6, wherein the first retaining structure of the elongated members is a slot, and wherein the steps of inserting the edges of the first and second covers into the first retaining structure includes positioning the edges of each of the first and second covers in the slot of the respective elongated member.

10. The method of claim 6, wherein the step of inserting the edges of the back plane includes orienting the back plane such that the back plane is generally perpendicular to the first and second covers.

11. A method of assembling a chassis, the method comprising the steps of:
 a) providing four identical elongated members, each of the elongated members having only two edge-retaining slots, including a first edge-retaining slot and a second edge-retaining slot;
 b) providing covers, a back plane, and at least one module having a module tab;
 c) securing the covers and the back plane relative to the elongated members, the covers and the back plane defining a chassis interior having a front opening for receipt of modules; and
 d) securing the at least one module within the chassis interior;
 e) wherein the first edge-retaining slot of each of the elongated members receives an edge of one of the covers, and wherein the second edge-retaining slot of at least three of the elongated members receives one of an edge of the back plane and the module tab.

12. The method of claim 11, wherein the step of securing the covers includes securing end covers to first and second ends of each of the elongated members.

13. The method of claim 12, wherein the step of securing the end covers includes fastening the end covers to the elongated members with fasteners.

14. The method of claim 11, wherein the step of securing the covers and the back plane includes orienting the back plane such that the back plane is secured generally perpendicular to the covers.

* * * * *